United States Patent [19]

Levinstein et al.

[11] Patent Number: 4,522,842
[45] Date of Patent: Jun. 11, 1985

[54] BORON NITRIDE X-RAY MASKS WITH CONTROLLED STRESS

[75] Inventors: Hyman J. Levinstein, Berkeley Heights; Shyam P. Murarka, New Providence; David S. Williams, Morristown, all of N.J.

[73] Assignee: AT&T Bell Laboratories, Murray Hill, N.J.

[21] Appl. No.: 416,290

[22] Filed: Sep. 9, 1982

[51] Int. Cl.³ ............................................. B05D 5/00
[52] U.S. Cl. ...................................... 427/8; 427/160; 427/255.2; 427/372.2; 430/5; 378/35
[58] Field of Search ............... 430/5, 966, 967; 427/8, 427/160, 372.2, 255.2; 378/34, 35; 148/128; 65/117

[56] References Cited

U.S. PATENT DOCUMENTS

| | | | |
|---|---|---|---|
| 3,892,973 | 7/1975 | Coquin et al. | 250/505 |
| 4,037,111 | 7/1977 | Coquin et al. | 250/505 |
| 4,171,489 | 10/1979 | Adams et al. | 250/510 |
| 4,253,029 | 2/1981 | Lepselter et al. | 250/505 |

OTHER PUBLICATIONS

A. C. Adams et al., "The Chemical Deposition of Boron-Nitrogen Films," *J. Electrochemical Society*, vol. 127, No. 2, Feb. 1980, pp. 399–405.
Shand, Glass Engineering Handbook, 2nd Ed., McGraw-Hill Book Co., New York, 1958, pp. 106–109.
R. J. Jaccodine et al., "Measurement of Strains at Si--SiO₂ Interface," *Journal of Applied Physics*, vol. 37, No. 6, May 1966, pp. 2429–2434.

*Primary Examiner*—John E. Kittle
*Assistant Examiner*—José G. Dees
*Attorney, Agent, or Firm*—Richard D. Laumann

[57] ABSTRACT

It has been found that stress in X-ray transparent films used to form masks for X-ray lithography also cause distortions of the film and of the high-resolution X-ray-absorptive pattern formed thereon. A method is disclosed which anneals boron nitride films for use in X-ray masks in such a way as to control stress.

20 Claims, 4 Drawing Figures

BORON NITRIDE X-RAY MASKS WITH CONTROLLED STRESS

TECHNICAL FIELD

This invention relates generally to processes for fabricating microminiature devices utilizing X-ray lithography and, more particularly, to processes which control stress in masks, i.e., produce masks having stress within a predetermined range, used for such lithography.

BACKGROUND OF THE INVENTION

The conventional fabrication sequence for making microminiature electronic devices, such as semiconductor integrated circuits, utilizes lithographic techniques. Such techniques are especially useful for devices such as integrated circuit memory, integrated circuit logic, and magnetic bubble memory technology, where there is a need to fabricate devices having small features with low defect density. In the effort to reduce costs and to increase the efficiency of devices such as semiconductor integrated circuits as well as make new devices, processes have improved and become increasingly sophisticated in the past decade. These improvements have resulted in both more devices on a single semiconductor body (commonly termed a "chip") and smaller device sizes.

A typical lithographic process reproduces a pattern in radiation-responsive materials, commonly termed resists, which coat the surface of a semiconductor wafer, each wafer ultimately yielding many chips. The resist is exposed to radiation with a mask between the resist and the radiation source. The resolution ultimately obtained in the pattern-delineated resist is thus limited by, among other factors, the mask. In order for the semiconductor wafer to be used efficiently, so as to obtain a low cost per bit or function performed, processes have been developed which yield a very accurate mask for patterning the resist, and hence, obtaining a faithful reproduction of the mask pattern in the resist.

Although known processes, such as photo and electron beam lithography, have been and are being used commercially, X-ray lithography is considered promising since, first, it offers possibilities of obtaining fine features and high throughput and second, it is potentially less expensive than electron beam lithography. However, the resolution obtained in the pattern-delineated resist is, of course, limited by the integrity of the mask structure and tolerances of the mask features. Hence, an effort has been devoted to developing an X-ray lithographic process which includes the fabrication of a suitable X-ray mask structure. A typical mask structure comprises an X-ray transparent film substrate in conjunction with an X-ray absorbing overlay pattern.

For example, in U.S. Pat. No. 3,892,973, issued on Feb. 15, 1976 to G. A. Coquin, J. R. Maldonado, and D. Maydan, entitled "Mask Structure for X-ray Lithography" and assigned to Bell Telephone Laboratories, Incorporated, an X-ray lithographic process suitable for replication of patterns having fine features is described. In accordance with an exemplary process, a thin sheet of Mylar polyester film, stretched over and bonded to a support member, is used as the film substrate for a metallic layer in which an X-ray absorptive pattern is formed, resulting in the mask.

The deposition and patterning of such a metallic pattern, on a stretched film, however, may introduce undesirable stresses in the film which result in distortion of the X-ray absorptive pattern. An advantageous mask structure which minimizes such stresses is disclosed in U.S. Pat. No. 4,037,111 issued on June 8, 1976 to G. A. Coquin, J. R. Maldonado, D. Maydan, and S. R. Somekh and assigned to Bell Telephone Laboratories, Incorporated. The mask substrate comprises a thin sheet of polyimide film stretched over and bonded to a 2- or 3-dimensionally stable support member. Deposited on the film is a three-layer metallization structure which minimizes stress-induced distortions in the X-ray absorptive pattern. In some instances, however, it has been found that thermally-induced dimensional changes in the film cause distortions in the metallic pattern formed on the film.

In U.S. Pat. No. 4,171,489, issued to A. C. Adams, C. D. Capio, H. J. Levinstein, A. K. Sinha, and D. N. Wang on Sept. 13, 1978, entitled "Radiation Mask Structure" and assigned to Bell Telephone Laboratories, Incorporated, another mask structure for X-ray lithography is described. The mask comprises a substrate made of a film of boron nitride, bonded to a support frame, on which an X-ray-absorptive material is deposited. Such a mask exhibits an advantageously and substantially distortion-free characteristic which is obtained through either low or high pressure CVD (chemical vapor deposition) techniques. However, since the film comprises boron nitride, which is exceedingly fragile, the mask is sometimes difficult to handle and is prone to breakage.

In U.S. Pat. No. 4,253,029 issued to M. P. Lepselter, H. J. Levinstein, and D. Maydan on May 23, 1979, and assigned to Bell Telephone Laboratories, Incorporated, there is described a mask substrate comprising a composite structure of a boron nitride member under tension and coated with a polyimide layer; furthermore, an X-ray-absorptive material is formed thereon. This substrate is mechanically strong and desirably X-ray transparent, but still has some undesirable distortions due to stress.

In all the described masks, the supporting inorganic film (e.g., boron nitride film) should be under slight tension so as to avoid the wrinkling or distortions that result when it is under compression. It has been found experimentally that the desired stress be within the range from 0.1 to $0.5 \times 10^9$ dynes/cm$^2$. For stresses below this range, the X-ray mask structure exhibits a tendency to wrinkle and distort; and for stresses above this range, an X-ray mask structure exhibits a tendency to break. Hence, it is desirable to fabricate masks with stress within this range.

Chemical vapor deposition, which can be defined as a material synthesis method in which vapor phase constituents react to form a solid film on a surface, has been increasingly used in the formation of substrates for X-ray absorptive patterns used in fabrication of X-ray masks. The growth of thin films by chemical vapor deposition (CVD) has become one of the most important methods of thin film formation because its high versatility permits depositing a very large variety of compounds at relatively low temperatures, in the form of either vitreous or crystalline layers having a high degree of perfection and purity.

In their paper "The Chemical Deposition of Boron-Nitrogen Films," published in the *Journal of Electrochemical Society* in February 1980, A. C. Adams and C. D. Capio, of Bell Telephone Laboratories, Incorporated, described the deposition process of films of a boron-nitrogen compound with a composition of approximately $B_6NH_x$, at reduced pressure, by reacting diborane and ammonia at temperatures between 250 degrees and 600 degrees C. It was found that x was a function of the deposition temperature. Through infrared spectra, they also observed that the films deposited in the low pressure chemical vapor deposition (LPCVD), reduced pressure reactor at 340 degrees C. had a lower stress than comparable films deposited at atmospheric pressure at 700 degrees C.

LPCVD of BN has been used in making masks for X-ray lithography. However, it has been found that deposition of large numbers of such films in one batch by LPCVD often leads to stresses within the deposited films that range from high compressive to high tensile, rendering a large percentage (as high as 90 percent) of the masks less suitable for commercial use as their stresses are outside the desired range.

Although the above methods are generally suitable for fabricating mask structures, it would be desirable to have a method for fabricating a mask structure for an X-ray lithographic system which could measure the as-deposited stress in the film and if it is outside a desired range, bring it into a desired range so that the structure would be more useful.

SUMMARY OF THE INVENTION

We have discovered a method for controlling the stress of boron nitride films, whereby we are able to manufacture masks for X-ray lithography having the stress within a desired range.

The method of the present invention comprises depositing boron nitride films by, for example, LPCVD, determining the stress, and annealing. The annealing step may be in vacuum or in hydrogen, depending upon whether the film is under compression or tension. More specifically, in one preferred embodiment, the gases $NH_3$ and $B_2H_6$ react to form a film comprising boron, nitrogen, and hydrogen; if the stress of the film is determined to be outside the desired range, the stress is altered to the desired range by annealing the boron nitride film. Using this method, films under tension or compression can be treated by annealing to produce films having a stress within a range that is suitable for X-ray mask fabrication.

DETAILED DESCRIPTION

Figure 1:
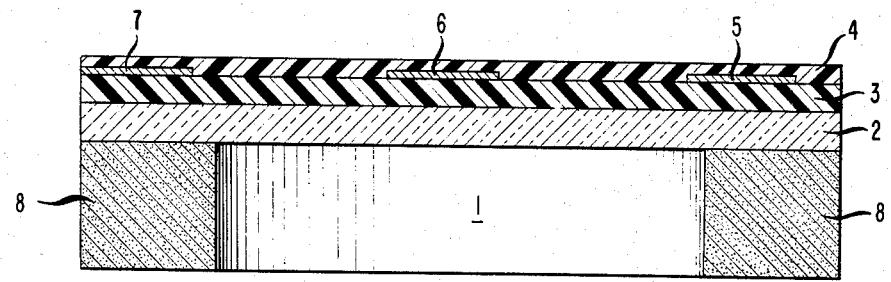
FIG. 1 is a schematic depiction of an X-ray mask structure in accordance with a specific embodiment of the invention.

A specific illustrative structure is shown in FIG. 1. It includes an X-ray transparent layer, 2, made of a material such as boron nitride (such material being covered by a polyimide film, 3), deposited on a polished surface of a conventional wafer made, for example, of silicon, wafer 1, to form a mask with an X-ray absorbing pattern, 5, 6, and 7, of a metal such as gold. An X-ray-transparent layer, 4, made, for example, of a protective material, such as, for example, beryllium or a monomer or polymer plastic coatings, is then deposited to protect the elements 5, 6, and 7 of the X-ray absorbing pattern from damage during handling and actual use in an X-ray lithographic system. The dashed lines associated with the silicon wafer 1 are intended to indicate that, in a subsequent processing step, a central portion of the silicon wafer will be removed, at which point only the perimeter of the wafer, 8, will remain as the supporting ring.

In a preferred embodiment, the boron nitride film is deposited by the low pressure chemical vapor deposition (LPCVD) technique. We have found that in constructing a mask, LPCVD is often preferred because the diffusivity of a gas is inversely related to pressure. The high diffusivity helps produce uniform films. Thus, as pressure is lowered from atmospheric to 0.5-1 Torr, the diffusivity increases by a factor of 1000.

The compounds which are used in BN deposition are the reactant gases ammonia ($NH_3$) and diborane ($B_2H_6$), with nitrogen as the carrier gas, which, in a LPCVD reactor, react to form what is commonly referred to as boron nitride. The deposited material may more precisely be referred to as amorphous BNH because we estimate its composition as 60 to 70 atomic percent hydrogen and the ratio of boron to nitrogen is estimated to be 3 to 1 by Rutherford backscattering spectroscopy. Applicants describe a representative embodiment for forming the boron nitride film. In this embodiment, the reactant gases, i.e., 100 percent of $NH_3$ and 15 percent of $B_2H_6$ mixed with 85 percent of $N_2$, are blended to form the desired ratio of $NH_3$ to $B_2H_6$, i.e., between 5 and 10 to 1. This ratio is desirable because small variations in the ratio cause only small variations in stress. The reactant gases are contained in two separate cylinders containing, respectively, 100 percent of $NH_3$ and 15 percent of $B_2H_6$ mixed with 85 percent of $N_2$, the carrier gas. Alternatively, a BNH film can be deposited using other percentages of $B_2H_6$ in nitrogen. The precise amount of $B_2H_6$ in $N_2$ is thus not critical, although deposition and annealing temperatures will differ depending upon the $B_2H_6$ concentration. For example, when 15 percent of $B_2H_6$ mixed with 85 percent of $N_2$ was used, the optimum deposition temperature was found to be 365 degrees C.$\pm 2$ degrees C. However, when only 2 percent of $B_2H_6$ was mixed with 98 percent of $N_2$, the optimum temperature ranges for the deposition and the annealing processes increased, so as to compensate for the loss of $B_2H_6$. For example, the deposition temperature increased to 370$\pm 2$ degrees C.

During the deposition process, we have found the deposition rates of 100 to 200 Angstroms a minute are conveniently used, and the total pressure is 0.5$\pm 0.1$ Torr. The optimum temperature, during deposition, is dependent upon the $B_2H_6$ concentration in nitrogen. When 15 percent $B_2H_6$ was used, the optimum temperature was found to be 365 degrees C.$\pm 2$ degrees C. Other temperatures will yield the same results, but are less preferred. For example, if the temperature is between 300 and 365 degrees C., the process would yield very slowly, i.e., the deposition rate is slow. If the temperature is between 365 and 700 degrees C., the uniformity of the film decreases and the stress would increase as the temperature increases. Deposition above 700 degrees C.$\pm 10$ degrees C. has not yielded acceptable results after the annealing step. Deposition below 300 degrees C. with desirably low concentration of $B_2H_6$ would be undesirable because of the inefficient deposition rate. Thus, the temperature should be less than 700 degrees C.

After deposition in a LPCVD reactor, the stress in the film is determined through any one of a number of well-known suitable techniques. In one of the most expeditiously used techniques, an optically levered laser beam measures the stress-induced change in the change in the radius of curvature. This nondestructive method requires no special sample preparation and minimal wafer handling. The wafer is placed on a stage driven by a constant-speed motor. A laser beam hits the wafer and is reflected. A photodetector moves until it receives the light. Electronic circuitry, which is well known, records the detector position (y axis) as a function of the stage position (x axis). A trace, representing the curvature of the wafer, is thus obtained. Similar traces before and after film deposition (or annealing) are obtained, and the radius of curvature is then calculated. The relationship between the stress and the radius of curvature is described by R. J. Jaccodine and W. A. Schlegel in *Journal of Applied Physics*, 37, pp. 2429-2434, May 1966. In accordance with the article, the stress may be determined from the relationship $$\sigma = \frac{E}{6(1-\nu)} \frac{D^2}{\Delta r t},$$

where $\sigma$ is the stress, E is the modulus of elasticity of the substrate, $\nu$ is the Poisson ratio of the substrate, D is the substrate thickness, t is the film thickness, and $\Delta r$ is the change in the radius of curvature. The stress in each wafer may be measured. Other techniques can, of course, be used.

We have found that if the stress is outside the desired range, that an annealing step can change the stress of the BNH film to a value within the desired range. The change in stress during annealing is believed to be caused by the changes in the concentration of entrapped or weakly bonded gaseous hydrogen in the film.

The annealing step parameters to be used depend upon whether the film is under compression (negative stress) or tension (positive stress).

If the film is under compression, the annealing step is designed to release entrapped gas, which causes the film to become more tensile. The annealing step takes place at a reduced pressure, i.e., less than atmospheric, typically between $10^{-5}$ Torr and 100 Torr, in an atmosphere of nitrogen, or an inert gas such as xenon, helium, argon, or in air. The latter atmosphere is less preferred because some reactions of the BNH film with the ambient atmosphere may occur.

Figure 2:
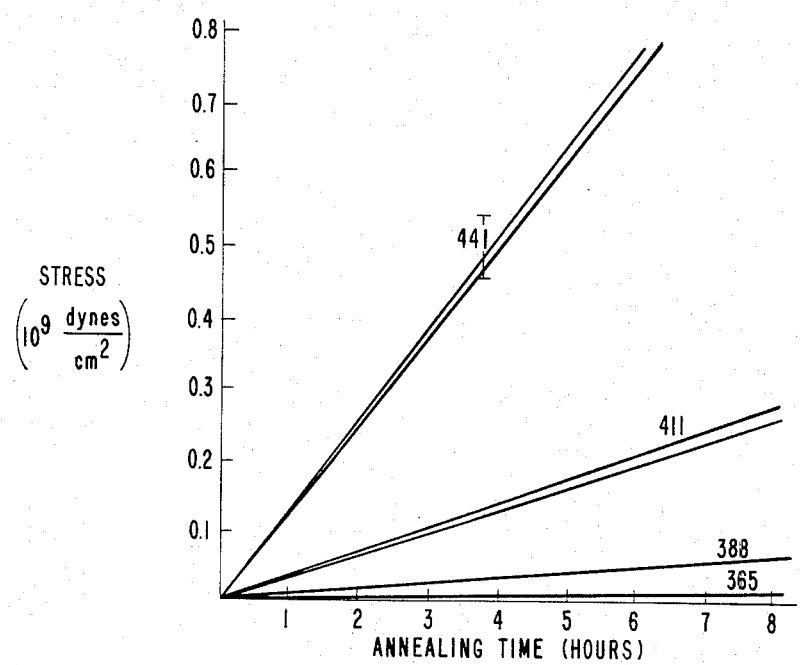
FIG. 2 is a graph showing stress change versus annealing time at a reduced total pressure, $2 \times 10^{-5}$ Torr, as a function of annealing temperature.

The rate of stress change is substantially linear in time and strongly dependent on temperature. FIG. 2 shows the stress vertically in units of $10^9$ dynes/cm$^2$ versus the annealing time horizontally in units of hours at a reduced total pressure, $2 \times 10^{-5}$ Torr. The annealing temperatures are indicated on the curves which show that measurable stress changes are obtained in 8 hours for annealing temperatures in the range between 360 and approximately 440 degrees C. in a vacuum. Temperatures below 360 degrees C. are undesirable because usually excessively long annealing times will be required unless only small changes are to be effected, and temperatures above approximately 440 degrees C. are undesirable because the rapid rate of stress change can lead to undesirably large changes in the stress which result in peeling of the films from the substrate at too high a stress. Thus, after measuring the stress and knowing the needed change, the proper annealing time and temperature are easily determined.

Figure 3:
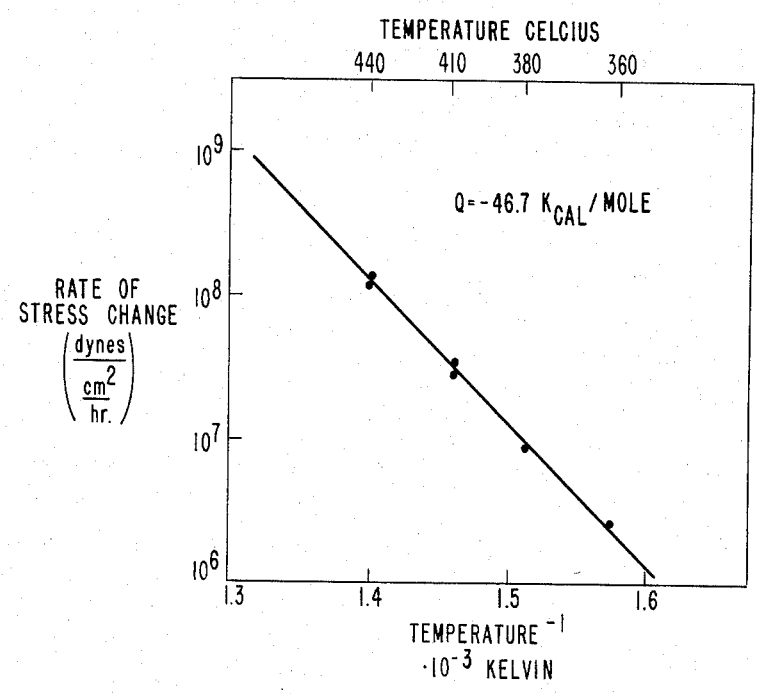
FIG. 3 is an Arrhenius plot of the annealing rate in vacuum showing an activation energy of $-46.7$ kcal/mole.

The temperature dependence of the rate of stress change in a vacuum in Arrhenius form with an activation energy of -46.7 kcal/mole is shown in FIG. 3. This exponential plot satisfies the following equation:

$$\text{Rate} = X \exp\left(\frac{-47.6 \frac{Kcal}{mole}}{RT}\right)$$

where R is the gas constant, T is the Kelvin temperature, and X is a constant which, in order to achieve the desired stress, equals $3.2 \times 10^{22}$ dynes/cm$^2$/hr. The plot demonstrates the temperature dependence of the rate of annealing and describes how the rate of change of stress can be calculated for any temperature within the range investigated.

Figure 4:
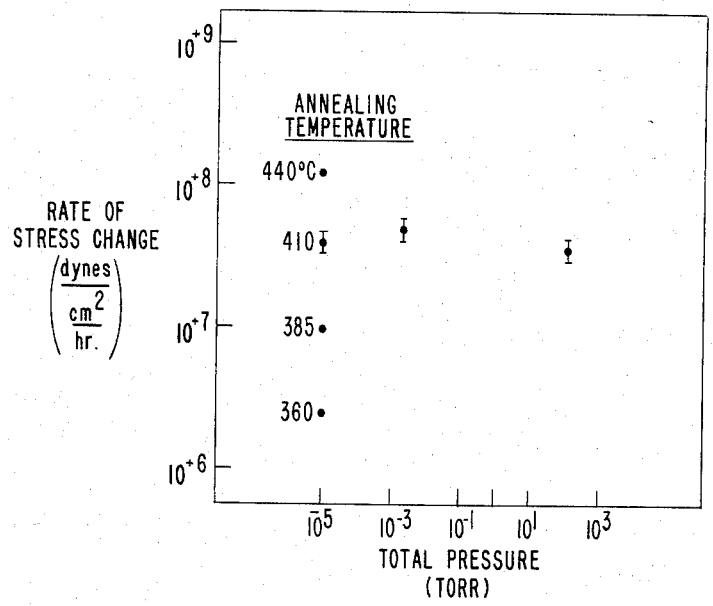
FIG. 4 is a graph showing the rate of stress change versus the total pressure for samples annealed at 410 degrees C.

The presence of varying amounts of nitrogen is shown in FIG. 4 to have no effect on the annealing rate. More specifically, FIG. 4 shows that the rate of stress change is not affected by the total pressure provided that the environment does not interact with the substrate; for example, reactive environments such as air which could deteriorate the substrate. The graph shows only pressure stability for 410 degrees C; however, other temperatures are expected to behave similarly. Moreover, for these results to be achieved, the ambient does not chemically react with the film or impede hydrogen removal. In this particular embodiment, the annealing furnace was evacuated and continuously back-filled with dry nitrogen in order to obtain the specified total pressures.

If the film is tensile, then the annealing step is performed in a hydrogen atmosphere. The tensile film absorbs hydrogen and becomes more compressive. The temperature in this procedure is also important and the process is carried out, in the preferred embodiment, at a temperature of approximately 340 degrees C. Annealing in hydrogen above such a temperature tends to result in a film which becomes more tensile, similar to annealing in vacuum. Below such a range, the change in stress is usually slow and is not preferred unless very small changes are to be made. When processing the film in the hydrogen furnace rather than in the vacuum one, the rate of stress was found to be a function of the anneal time which is slightly dependent upon the hydrogen pressure. The annealing step is expeditiously carried out in an atmosphere comprising 100 percent H$_2$.

Using these techniques routinely, several BNH films with tensile stress in the range of 0.5 to $0.8 \times 10^9$ dynes/cm$^2$ have been lowered into the stress range desired for mask fabrication, and compressive stresses as low as $0.4 \times 10^9$ dynes/cm$^2$ were brought into the acceptable range.

An X-ray absorbing material is deposited and patterned by conventional and well-known techniques. A layer of protective material may be deposited over the patterned absorbing material.

Although the invention has been described in terms of a specific embodiment, various modifications can be made without departing from the scope of the invention. For example, other X-ray transparent materials, such as boron carbide, may be used. Additionally, reactant gases other than NH$_3$ and B$_2$H$_6$ may be used.

What is claimed is:

1. A process for fabricating a mask structure for X-ray lithography, comprising the steps of
    depositing on a support member a layer of an X-ray transparent material,
    determining the stress of the layer,
    annealing said layer subsequent to said deposition to obtain therein a stress in a desired range, said annealing step
    controlling the stress subsequent to said deposition, whereby the film is made more tensile or more compressive depending on what is desired.

2. A process as recited in claim 1 wherein said layer of X-ray transparent material is selected from the group consisting of boron nitride and boron carbide.

3. A process as recited in claim 2 in which said material comprises boron nitride.

4. A process as recited in claim 2 or 3 comprising the further step of forming a patterned layer of X-ray absorbing material on said X-ray transparent material.

5. A process as recited in claim 4 wherein said deposition step comprises a LPCVD process.

6. A process as recited in claim 5 wherein said deposition step is carried out at a temperature less than 700 degrees C.

7. The process of claim 5 wherein said determining the stress is by measuring each wafer.

8. A process as in claim 5 wherein the annealing step is in an atmosphere comprising hydrogen.

9. A process as recited in claim 8 in which said annealing is at a temperature of approximately 340 degrees C.

10. A process as in claim 5 wherein said annealing step is in an atmosphere at a reduced pressure.

11. A process as recited in claim 10 in which said atmosphere comprises an inert gas selected from the group consisting of nitrogen, argon, helium, xenon, neon, krypton.

12. A process as recited in claim 11 in which said annealing is at a temperature less than 440 degrees C.

13. A process as recited in claim 12 in which said annealing is at a temperature greater than 360 degrees C.

14. A process as recited in claim 12 in which said inert gas is nitrogen.

15. A process as recited in claim 12 in which said inert gas is argon.

16. A process as recited in claim 12 in which said inert gas is helium.

17. A process as recited in claim 12 in which said inert gas is xenon.

18. A process as recited in claim 12 in which said inert gas is neon.

19. A process as recited in claim 12 in which said inert gas is krypton.

20. A process as recited in claim 5 in which said depositing step comprises:
    flowing ammonia ($NH_3$) and diborane ($B_2H_6$), with nitrogen as the carrier gas, and said annealing step is within the range 500 degrees C. $\pm$ 200 degrees C. thereby yielding a film in a desired stress range of about 0.1 to $0.5 \times 10^9$ dynes/cm$^2$.

* * * * *